United States Patent
Campbell et al.

(10) Patent No.: US 7,836,940 B2
(45) Date of Patent: Nov. 23, 2010

(54) MICROCHANNEL COOLING DEVICE FOR SMALL HEAT SOURCES

(75) Inventors: Geoffrey O. Campbell, Brighton, CO (US); Jack M. Fryer, Huntington Beach, CA (US)

(73) Assignee: MicroVection, Inc., Brighton, CO (US)

( * ) Notice: Subject to any disclaimer, the term of this patent is extended or adjusted under 35 U.S.C. 154(b) by 1151 days.

(21) Appl. No.: 11/477,344

(22) Filed: Jun. 28, 2006

(65) Prior Publication Data

US 2007/0000644 A1    Jan. 4, 2007

Related U.S. Application Data

(60) Provisional application No. 60/695,517, filed on Jun. 29, 2005.

(51) Int. Cl.
*F28F 7/00* (2006.01)
(52) U.S. Cl. ............ 165/80.4; 165/104.33; 165/185; 361/689; 361/702
(58) Field of Classification Search ............ 165/80.4, 165/170, 104.33; 361/699, 689, 704
See application file for complete search history.

(56) References Cited

U.S. PATENT DOCUMENTS

| | | | | |
|---|---|---|---|---|
| 3,455,376 A | * | 7/1969 | Beurtheret | ............ 165/133 |
| 4,450,472 A | | 5/1984 | Tuckerman et al. | |
| 4,573,067 A | | 2/1986 | Tuckerman et al. | |
| 4,744,414 A | * | 5/1988 | Schon | ............ 165/167 |
| 5,005,640 A | | 4/1991 | Lapinski et al. | |
| 5,144,531 A | * | 9/1992 | Go et al. | ............ 361/702 |
| 5,265,670 A | * | 11/1993 | Zingher | ............ 165/80.4 |
| 5,835,345 A | | 11/1998 | Staskus et al. | |
| 6,084,774 A | | 7/2000 | Bartley et al. | |
| 6,301,109 B1 | | 10/2001 | Chu et al. | |
| 2001/0016985 A1 | * | 8/2001 | Insley et al. | ............ 29/890.039 |
| 2004/0031281 A1 | * | 2/2004 | Vaiyapuri et al. | ............ 62/259.2 |

OTHER PUBLICATIONS

M.G. Grote et al., *Test Results of Water Thin Coolers at Heat Fluxes from 5 to 125 W/cm²*, McDonnell Douglas Corp., SAE Technical Paper Series, SAE The Engineering Society for Advancing Mobiity Land Sea Air and Space, Jul. 11-13, 1988, pp. 1-13, Society of Automotive Engineers, Inc., US.

R.E. Hendron et al., *Stackable wafer thin coolers for high power laser diode arrays*, McDonnell Douglas Electronic Systems Company, 1990, pp. 330-340, vol. 1219, SPIE Laser-Diode Technology and applications II, US.

X.A. Zhu et al., *Thermal-Fluid Modeling of Microchannel Cooling for High Power Solid-State Laser*, Air Force Research Laboratory, Wright-Patterson AFB, May 24, 2003, pp. 1-26, Ohio, US.

G.O. Campbell et al. "*Enhanced Microchannel Cooler Development*," ENMC01-05, Jan. 26, 2003, pp. 103, Final Report, Item 0001AE, microVection, Inc., USA.

\* cited by examiner

*Primary Examiner*—Terrell L McKinnon
(74) *Attorney, Agent, or Firm*—Townsend and Townsend and Crew LLP

(57) ABSTRACT

According to the invention, an apparatus for transferring heat with a target is disclosed. The apparatus may include a body which defines a surface, inlet port, inlet manifold passages, heat transfer passages, outlet manifold passages, and outlet port. The surface may couple the target with the body. The inlet port may be configured to receive and direct a fluid into inlet manifold passages. The inlet manifold passages may be configured to receive and direct the fluid to the heat transfer passages. The heat transfer passages may be configured to receive and direct the fluid in a direction substantially parallel to the surface and substantially perpendicular the input manifold passages. The outlet manifold passages may be configured to receive and direct the fluid to an outlet port. The outlet port may be configured to receive and output the fluid.

20 Claims, 8 Drawing Sheets

MICROCHANNEL COOLING DEVICE FOR SMALL HEAT SOURCES

PRIORITY CLAIM

This application claims priority to Provisional U.S. Patent Application No. 60/695,517 filed Jun. 29, 2005, entitled "Microchannel Cooling Device for Small Heat Sources," the entire disclosure of which is hereby incorporated by reference as if fully set forth herein.

STATEMENT AS TO RIGHTS TO INVENTIONS MADE UNDER FEDERALLY SPONSORED RESEARCH OR DEVELOPMENT

The United States Government has certain rights in this invention pursuant to USAF Contract F33615-03-C-2343.

BACKGROUND OF THE INVENTION

Various semiconductor devices, such as laser diodes, power transistors or central processing unit chips, may dissipate large amounts of waste power over very small areas. This may produce a very high heat flux that can be removed to extend the service life and proper operation of such components. Because these components have relatively low operating temperatures, successful heat removal may necessitate minimal heat flow resistance between the heat source and the heat sink.

Some current heat removal techniques for such applications may involve microchannel cooling of individual semiconductor devices. For at least some of these cooling configurations, relatively large microchannel passages may be used. These passages may require high coolant flow rates to provide low thermal resistances, and may be limited in their thermal performance even at such flow rates.

Various disadvantages may result from these high flow rates. Higher flow rates may incur larger flow resistance penalties in the system, and associated cooling system components such as pumps, lines, filters, valves, reservoirs, and radiators may require increased flow capacity. Additionally, the high velocities of the coolant flow may lead to erosion of various components, including the walls of the microchannel cooling passages within the cooler itself, and this may cause increased thermal resistance and decreased service life.

BRIEF SUMMARY OF THE INVENTION

In one embodiment, an apparatus for transferring heat with a target is provided. The apparatus may include a body, and the body may define a surface, one or more inlet ports, a plurality of inlet manifold passages; a plurality of heat transfer passages, a plurality of outlet manifold passages, and one or more output ports. The surface may couple the target with the body, and heat may transfer between the target and the body when the target is coupled with the body. The inlet port may be configured to receive a fluid and direct the fluid into a plurality of inlet manifold passages. The plurality of inlet manifold passages may be configured to receive the fluid from the inlet port and direct the fluid to a plurality of heat transfer passages. The plurality of heat transfer passages may be configured to: receive the fluid from the plurality of inlet manifold passages; direct the fluid in a direction substantially parallel to the surface and substantially perpendicular to the plurality of input manifold passages; and direct the fluid to a plurality of outlet manifold passages, where heat may transfer between the body and the fluid when fluid flows through the plurality of heat transfer passages. The plurality of outlet manifold passages may be configured to receive the fluid from the plurality of heat transfer passages and direct the fluid to an outlet port. The outlet port may be configured to receive the fluid from the plurality of outlet manifold passages and output the fluid.

In another embodiment, an apparatus for transferring heat with a target is provided. The apparatus may include a plurality of sheets, where the plurality of sheets are coupled such that a body is formed by the coupled plurality of sheets. The body may define a surface, an inlet port, a plurality of inlet manifold passages, a plurality of heat transfer passages, a plurality of outlet manifold passages, and an outlet port. The surface may couple the target with the body, and heat may transfers between the target and the body when the target is coupled with the body. The inlet port may be configured to receive a fluid and direct the fluid into a plurality of inlet manifold passages. The plurality of inlet manifold passages may be configured to receive the fluid from the inlet port and direct the fluid to a plurality of heat transfer passages. The plurality of heat transfer passages may be configured to receive the fluid from the plurality of inlet manifold passages; direct the fluid in a direction substantially parallel to the surface and substantially perpendicular to the plurality of input manifold passages; and direct the fluid to a plurality of outlet manifold passages, where heat may transfer between the body and the fluid when fluid flows through the plurality of heat transfer passages. The plurality of outlet manifold passages may be configured to receive the fluid from the plurality of heat transfer passages and direct the fluid to an outlet port. The outlet port may be configured to receive the fluid from the plurality of outlet manifold passages and output the fluid.

In another embodiment, an apparatus for transferring heat with a target is provided. The apparatus may include an upper sheet, a plurality of interior sheets, and a lower sheet. The upper sheet may define a surface for coupling with a target, where heat may transfer between the target and the upper sheet when the target is coupled with the surface. At least one of the upper sheet, the plurality of interior sheets, and the lower sheet may define an inlet port for receiving a fluid. The plurality of interior sheets may be coupled with the upper sheet, where heat may transfer between the upper sheet and the plurality of interior sheets. The plurality of interior sheets may define a plurality of inlet manifold passages for receiving the fluid from the inlet port; a plurality of heat transfer passages for receiving the fluid from the plurality of inlet manifold passages, where heat transfers between the fluid and the plurality of interior sheets, and where the plurality of heat transfer passages may be configured to direct the fluid in a direction substantially parallel to the surface; and a plurality of outlet manifold passages for receiving the fluid from the plurality of heat transfer passages. The lower sheet be coupled with at least one of the plurality of interior sheets. The lower sheet may also define an outlet port configured to receive the fluid from the plurality of outlet manifold passages and output the fluid.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

The present invention is described in conjunction with the appended figures.

Figure 1:
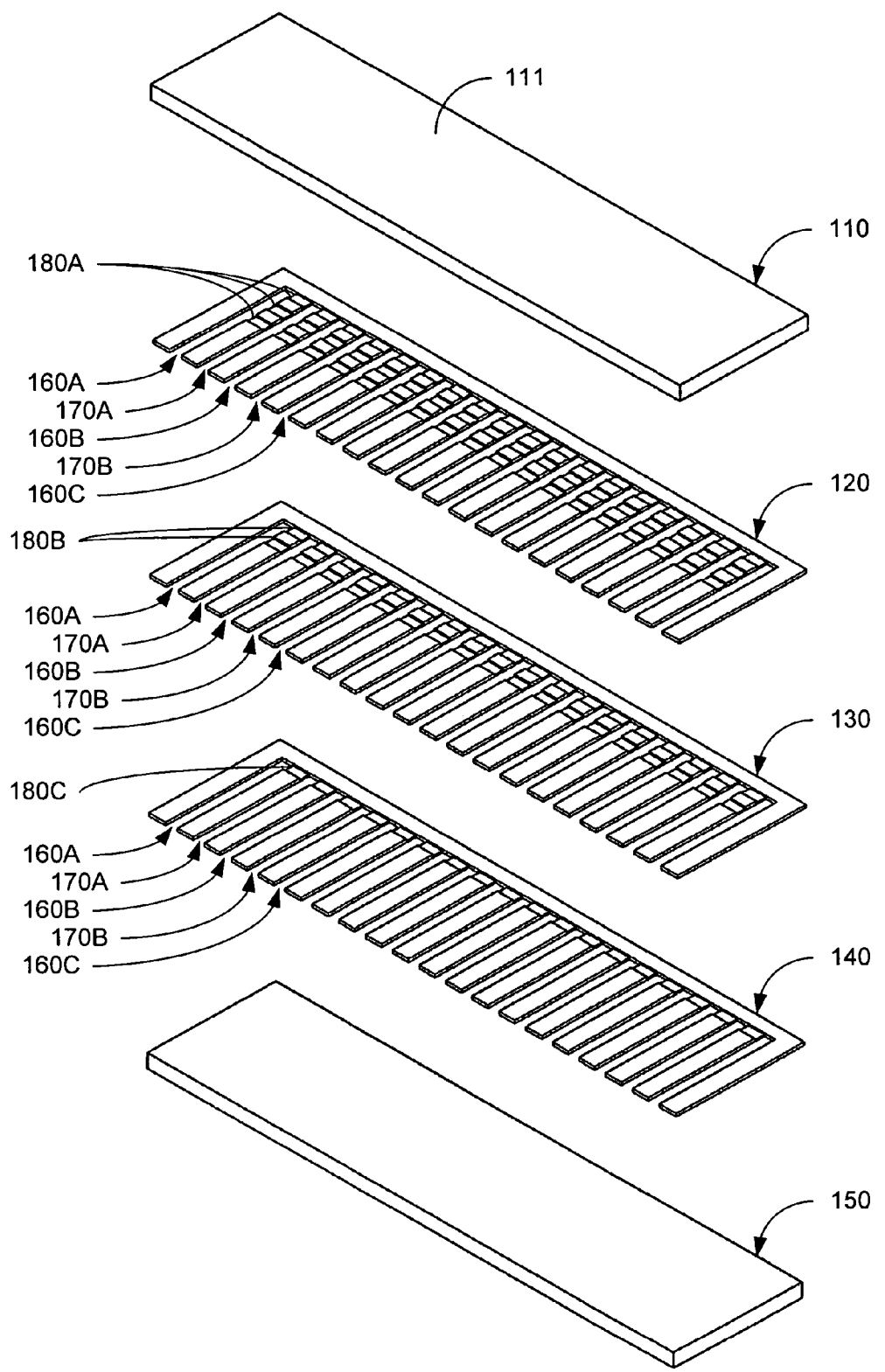
FIG. 1 is an exploded isometric drawing of the components of an apparatus for transferring heat with a target.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION OF THE INVENTION

The ensuing description provides exemplary embodiments only, and is not intended to limit the scope, applicability or configuration of the disclosure. Rather, the ensuing description of the exemplary embodiments will provide those skilled in the art with an enabling description for implementing an exemplary embodiment. It being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details.

In one embodiment, an apparatus for transferring heat with a target is provided. The apparatus may include a body, and the body may define a surface, an inlet port, a plurality of inlet manifold passages; a plurality of heat transfer passages, a plurality of outlet manifold passages, and an output port. The target may, merely by way of example, be a heat source.

The surface may couple the target with the body, and heat may transfer between the target and the body when the target is coupled with the body. The inlet port may be configured to receive a fluid and direct the fluid into a plurality of inlet manifold passages. The plurality of inlet manifold passages may be configured to receive the fluid from the inlet port and direct the fluid to a plurality of heat transfer passages. In some embodiments, the plurality of inlet manifold passages may be configured to direct the fluid in a direction substantially parallel to the surface.

The plurality of heat transfer passages may be configured to: receive the fluid from the plurality of inlet manifold passages; direct the fluid in a direction substantially parallel to the surface and substantially perpendicular to the plurality of input manifold passages; and direct the fluid to a plurality of outlet manifold passages, where heat may transfer between the body and the fluid when fluid flows through the plurality of heat transfer passages.

The plurality of outlet manifold passages may be configured to receive the fluid from the plurality of heat transfer passages and direct the fluid to an outlet port. The outlet port may be configured to receive the fluid from the plurality of outlet manifold passages and output the fluid. In some embodiments, the plurality of outlet manifold passages may be configured to direct the fluid in a direction substantially parallel to the surface.

In another embodiment, an apparatus for transferring heat with a target is provided. The apparatus may include a plurality of sheets, where the plurality of sheets are coupled such that a body is formed by the coupled plurality of sheets. The body may define a surface, one or more inlet ports, a plurality of inlet manifold passages, a plurality of heat transfer passages, a plurality of outlet manifold passages, and one or more outlet ports.

In some embodiments, the plurality of sheets may include an upper sheet, a plurality of interior sheets, and a lower sheet. In various embodiments the upper sheet or the lower sheet may define the surface. At least one of the upper sheet, the plurality of interior sheets, and the lower sheet may define the inlet port. The plurality of interior sheets may define the plurality of inlet manifold passages, the plurality of heat transfer passages, and the plurality of outlet manifold passages. In some embodiments, at least one of the upper sheet, the plurality of interior sheets, and the lower sheet may define the outlet port.

In an exemplary embodiment, all of the sheets may define the inlet port as well as the outlet port. In other embodiments, only a portion of the sheets may define either port. For example, in some embodiments, the upper sheet and some of the plurality of interior sheets in proximity to the upper sheet may define the inlet port. In these embodiments, the outlet port may be defined all of the sheets besides the lower sheet or possibly by the lower sheet and some of the plurality of interior sheets in proximity to the lower sheet.

Each of the plurality of sheets may be made from a variety of thermally conductive, low-expansion materials, including, but not limited to, molybdenum, tungsten, nickel, aluminum, stainless steel, silicon, beryllia, aluminum nitride, silicon carbide, chemical vapor deposition diamond, copper-diamond, copper-graphite, copper tungsten, and copper-molybdenum. In an exemplary embodiment, each of the plurality of sheets may be made from copper or a copper alloy. In some embodiments, each of the plurality of sheets may be made from a different material. Each sheet may be a certain shape. Some sheets may have the same shape, while some sheets may have unique shapes. The shape of any one sheet may be formed by photochemical etching or other type of etching. Other manufacturing methods may also be employed, including, but not limited to, laser machining and micro-machining methods.

The plurality of sheets may be coupled using various methods, including, but not limited to, soldering, brazing, and diffusion bonding. In embodiments where diffusion bonding is employed, the plurality of sheets may be coated with a diffusion aid. In some embodiments, the diffusion aid may be nickel or other suitable substance. In some embodiments, the sheets may be coupled so that they are "stacked," and corresponding features of each sheet may combine to form features of the body of the apparatus.

In some embodiments, the upper and lower sheet may be characterized by a thickness, and the upper and lower sheet may be between about 50 microns and about 10,000 microns thick. In some embodiments, the upper and lower sheet may be the same thickness, while in other embodiments, they may be of different thickness. In an exemplary embodiment, both the upper and lower sheet may be about 250 microns thick.

In some embodiments, each of the plurality of interior sheets may be characterized by a thickness, and each of the plurality of interior sheets may be between about 12.5 microns and about 500 microns thick. In an exemplary embodiment, each of the plurality of interior sheets is about 50 microns thick.

The surface may couple the target with the body, and heat may transfer between the target and the body when the target is coupled with the body. The inlet port may be configured to receive a fluid and direct the fluid into a plurality of inlet manifold passages. The plurality of inlet manifold passages may be configured to receive the fluid from the inlet port and direct the fluid to a plurality of heat transfer passages. The fluid may be any heat transfer fluid known in the art, including, but not limited to, distilled water, deionized water, ethylene glycol, diethylene glycol, propylene glycol, acetone, ammonia, dielectric fluids such as the Fluorinert™ series, fluids with large operating temperature ranges such as the Dowtherm™ and Coolanol™ series, and brines and aqueous mixtures.

In some embodiments the inlet manifold passages may be characterized by a width, and each of plurality of inlet manifold passages may be in between about 100 microns and about 2000 microns wide. In some embodiments, each of the plurality of inlet manifold passages may be about 200 microns wide.

The plurality of heat transfer passages may be configured to receive the fluid from the plurality of inlet manifold passages; direct the fluid in a direction substantially parallel to the surface and substantially perpendicular to the plurality of input manifold passages; and direct the fluid to a plurality of outlet manifold passages, where heat may transfer between the body and the fluid when fluid flows through the plurality of heat transfer passages. Each of the plurality of heat transfer passages may have a height in the range of about 10 microns to about 250 microns, and a width in the range of about 50 microns to about 1250 microns. In some embodiments, the heat transfer passages may be microchannels. Microchannels may be any passage with a hydraulic diameter of about 500 microns or less.

Various embodiments of the dimension may define one or more heat transfer passages between each inlet manifold passage and outlet manifold passage. In some embodiments, the interior sheets coupled closer to the upper sheet may define more heat transfer passages than interior sheets coupled closer to the lower sheet define. In other embodiments, all of the interior sheets may define the same number of heat transfer passages.

For example, in two embodiments with 15 interior sheets, the first embodiment may define: three heat transfer passages between each inlet manifold passage and outlet manifold passage in the five sheets closest to the surface; two heat transfer passages between each inlet manifold passage and outlet manifold passage in the next five sheets; and one heat transfer passage between each inlet manifold passage and outlet manifold passage in the five sheets furthest from the surface. In the second example embodiment, every interior sheet may define the same number of heat transfer passages between each inlet manifold passage and outlet manifold passage.

In some embodiments, each of the sheets may be characterized by a thickness and each of the plurality of heat transfer passages may be characterized by a height. The height of each of the plurality of heat transfer passages may be less than the thickness of at least one of the plurality of sheets. In some embodiments, the height of each of the plurality of heat transfer passages may be substantially half of the thickness of at least one of the plurality of sheets.

The plurality of outlet manifold passages may be configured to receive the fluid from the plurality of heat transfer passages and direct the fluid to an outlet port. The outlet port may be configured to receive the fluid from the plurality of outlet manifold passages and output the fluid.

In some embodiments the outlet manifold passages may be characterized by a width, and each of plurality of outlet manifold passages may be in between about 100 microns and about 2000 microns wide. In some embodiments, each of the plurality of outlet manifold passages may be about 200 microns wide.

In some embodiments, the apparatus may also include the target. The target may, merely by way of example, be a laser diode, a power transistor, or a central processor unit chip. If the target is a laser diode, the laser diode may have an average heat flux of about 1000 Watts per square centimeter and a 1 millimeter by 10 millimeter footprint.

In another embodiment, an apparatus for transferring heat with a target is provided. The apparatus may include an upper sheet, a plurality of interior sheets, and a lower sheet.

The upper sheet may define a surface for coupling with a target, where heat may transfer between the target and the upper sheet when the target is coupled with the surface. At least one of the upper sheet, the plurality of interior sheets, and the lower sheet may define at least one inlet port for receiving a fluid.

The plurality of interior sheets may be coupled with the upper sheet, where heat may transfer between the upper sheet and the plurality of interior sheets. The plurality of interior sheets may define a plurality of inlet manifold passages for receiving the fluid from the inlet port; a plurality of heat transfer passages for receiving the fluid from the plurality of inlet manifold passages, where heat transfers between the fluid and the plurality of interior sheets, and where the plurality of heat transfer passages may be configured to direct the fluid in a direction substantially parallel to the surface; and a plurality of outlet manifold passages for receiving the fluid from the plurality of heat transfer passages. In this or other embodiments, the heat transfer passages may be any shape between the plurality of inlet manifold passages and the plurality of outlet manifold passages. In some embodiments, different heat transfer passages within the same body may be different shapes. Merely by way of example, the heat transfer passages may be curved, serpentine, or tapered. Other two dimensional patterns are also possible.

The lower sheet be coupled with at least one of the plurality of interior sheets. The lower sheet may also define at least one outlet port configured to receive the fluid from the plurality of outlet manifold passages and output the fluid.

Turning now to FIG. 1, an exploded isometric drawing of the components of an apparatus of the invention for transferring heat with a target is shown. The components of a body 100 in this embodiment include an upper sheet 110, an first interior sheet 120 having three heat transfer passages 180A between each inlet manifold passage 160 and outlet manifold passage 170, a second interior sheet 130 having two heat transfer passages 180B between each inlet manifold passage 160 and outlet manifold passage 170, a third interior sheet 140 having one heat transfer passage 180C between each inlet manifold passage 160 and outlet manifold passage 170, and a lower sheet 150. The sheets may be coupled together to form body 100. A portion of the sheets which form an inlet port and an outlet port is not shown in FIG. 1, but will be shown in greater detail in FIG. 5, FIG. 6, FIG. 7, and FIG. 8.

In some embodiments, a body 100 may be formed of differing numbers and types of upper sheets, interior sheets, and lower sheets. While the embodiment shown in FIG. 1 has three interior foils 120, 130, 140, each having a different number of heat transfer passages between each inlet manifold channel 160 and outlet manifold channel 170, other embodiments may be of different configurations. In some embodiments, all interior sheets may have the same number of heat transfer passages between each inlet manifold channel 160 and outlet manifold channel 170. In other embodiments, the sheet layout may be substantially as shown in FIG. 1, except having multiple first interior sheets 120, multiple second interior sheets 130, and multiple third interior sheets 140. In some embodiments, more or less configurations of interior sheets may be used, with each configuration having different number of heat transfer passages between each inlet manifold passage 160 and outlet manifold passage 170. The efficiency of the apparatus in transferring heat with a target may be adjusted by varying fluid flow rates, changing the size of apparatus passages and features, and the number of passages and features.

The top of upper sheet 110 may define a surface 111 for coupling a target with body 100. In some embodiments, the target may be bonded to surface 111 with another substance, for example, a thermally conductive paste. When all sheets 110, 120, 130, 140, 150 are coupled together to form body 100, heat may flow between body 100 and the target. Interior sheets 120, 130, 140 may form multiple inlet manifold passages 160, and outlet manifold passages 170. Only inlet manifold passages 160A, 160B, 160C and outlet manifold passages 170A, 170B are specifically labeled in FIG. 1, but the pattern of alternating inlet manifold passages 170 and outlet manifold passages 180 continues down the length of each interior sheets 120, 130, 140.

Figure 2:
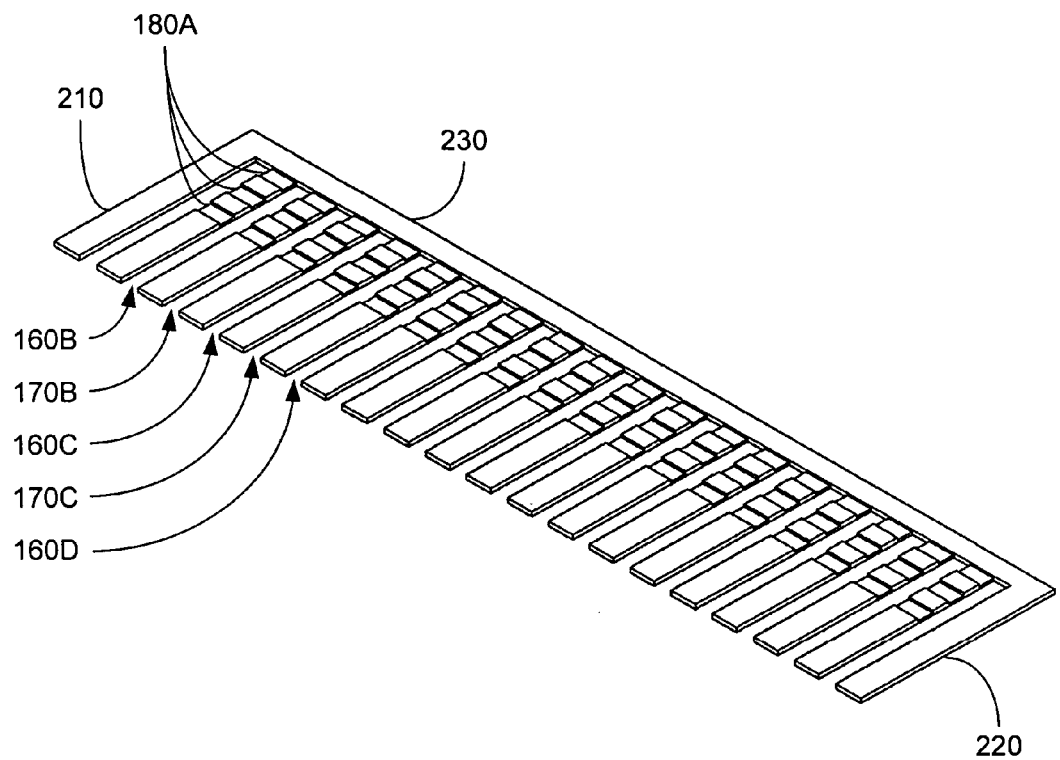
FIG. 2 is an isometric drawing of an interior sheet of the apparatus shown in FIG. 1.

FIG. 2 shows a closer view isometric drawing of first interior sheet 120 of the apparatus shown in FIG. 1. Inlet manifold passages 160, outlet manifold passages 170, and heat transfer passages 180 can be seen more clearly in FIG. 2. Also note that the portions of interior sheet 120 which form the sidewalls 210, 220 and front wall 230 of body 100. On the side of interior sheet 120 may extend in different configurations in a direction opposite front wall 230 to form inlet and outlet ports which will be shown in greater detail in FIG. 5, FIG. 6, FIG. 7, and FIG. 8.

Figure 3:
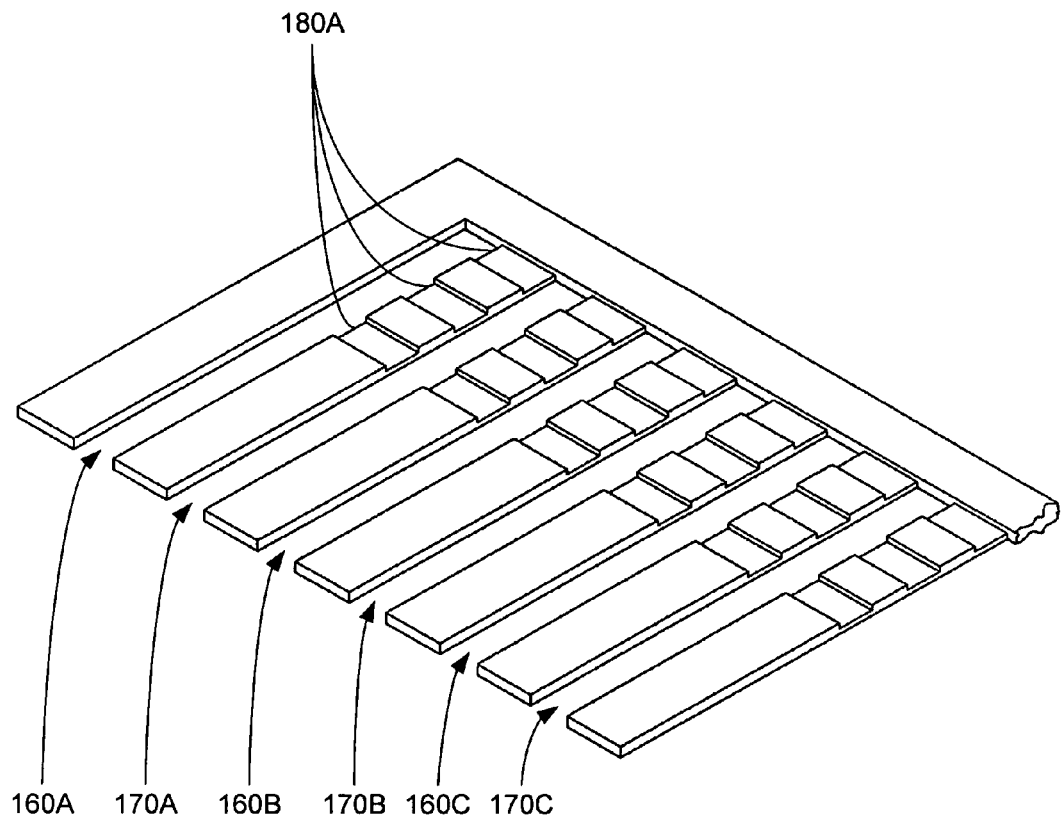
FIG. 3 is an isometric drawing of a portion of the interior sheet shown in FIG. 2.

FIG. 3 shows a closer view of a portion of first interior sheet 120 shown in FIG. I and FIG. 2. In this embodiment, it may be seen how the width of the inlet manifold passages 160 and outlet manifold passages 170 may be about the same width as each one of the three heat transfer passages 180A. The interior walls 310 may be a different width. In other embodiments, the dimensions of the various features may be different as described above. The depth of heat transfer passages 180 in this embodiment may be about half the thickness of interior sheet 120. In other embodiments, the depth of heat transfer passages 180 may be more or less than the thickness of interior sheet 120.

Figure 4:
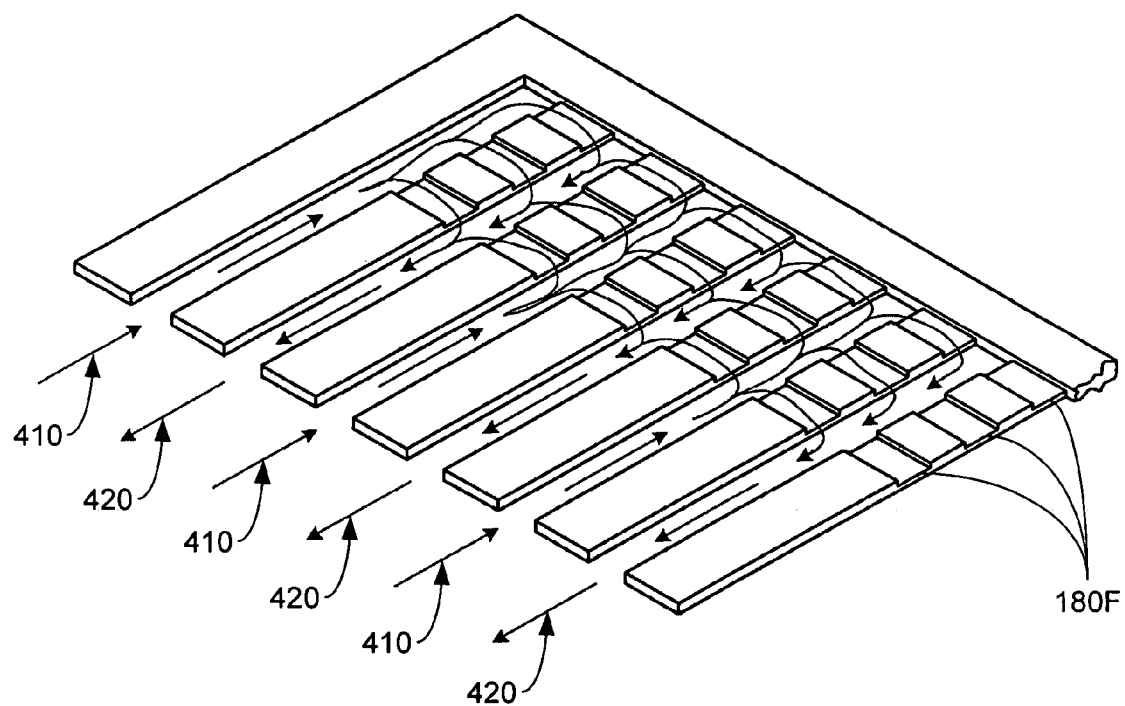
FIG. 4 is an isometric drawing of the same portion of the interior sheet shown in FIG. 2, except also showing fluid flow patterns through the sheet.

FIG. 4 shows an isometric drawing of the same portion of first interior sheet 120 shown in FIG. 3, except also showing fluid flow patterns 410, 420 through the sheet. Fluid may be received by inlet manifold passages 160 as shown by directional arrows 410, be directed through heat transfer passages 180, and received by outlet manifold passages 170 as shown by direction arrows 420.

Figure 5:
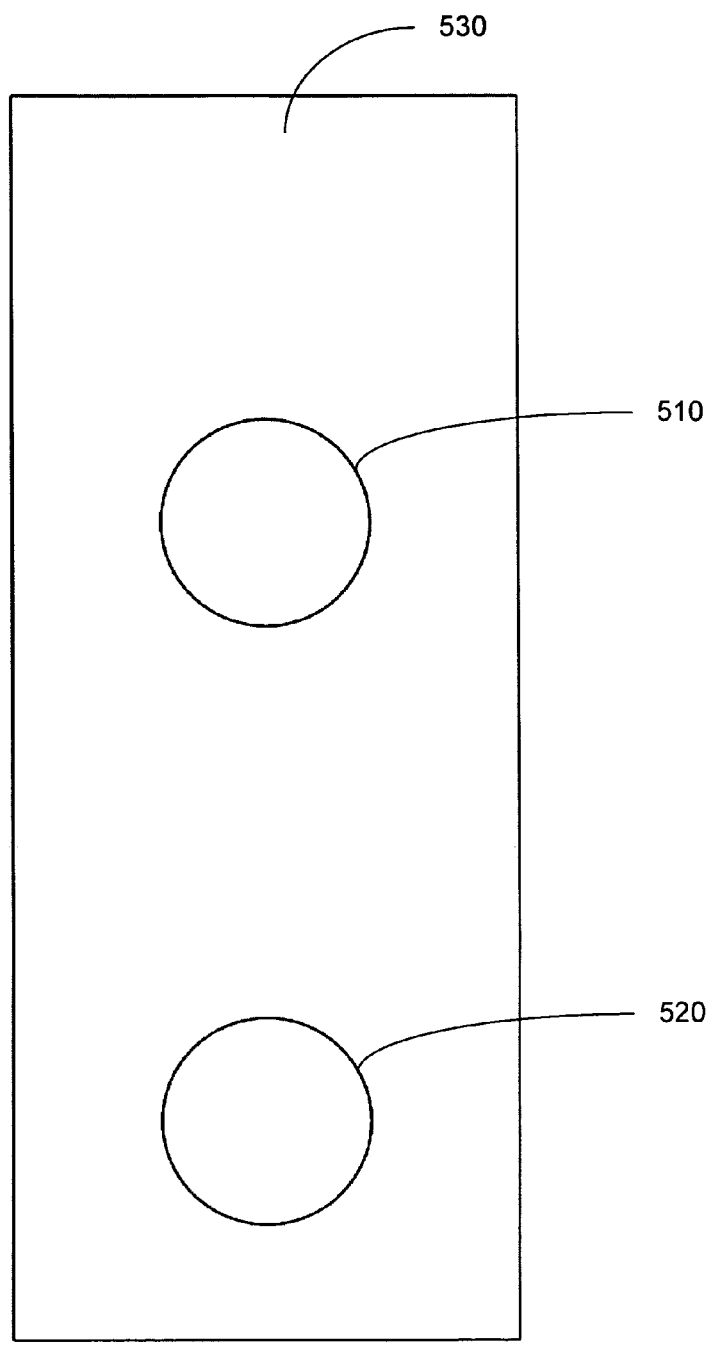
FIG. 5 is a plan view of an upper sheet which may form at least a portion of an apparatus for transferring heat with a target.

FIG. 5 shows a plan view of an upper sheet 500, including an inlet port 510 and an outlet port 520 which may form at least a portion of an apparatus for transferring heat with a target. A surface 530, or portion of the top of upper sheet 500, may also be defined for coupling a target to upper sheet 500.

Figure 6:
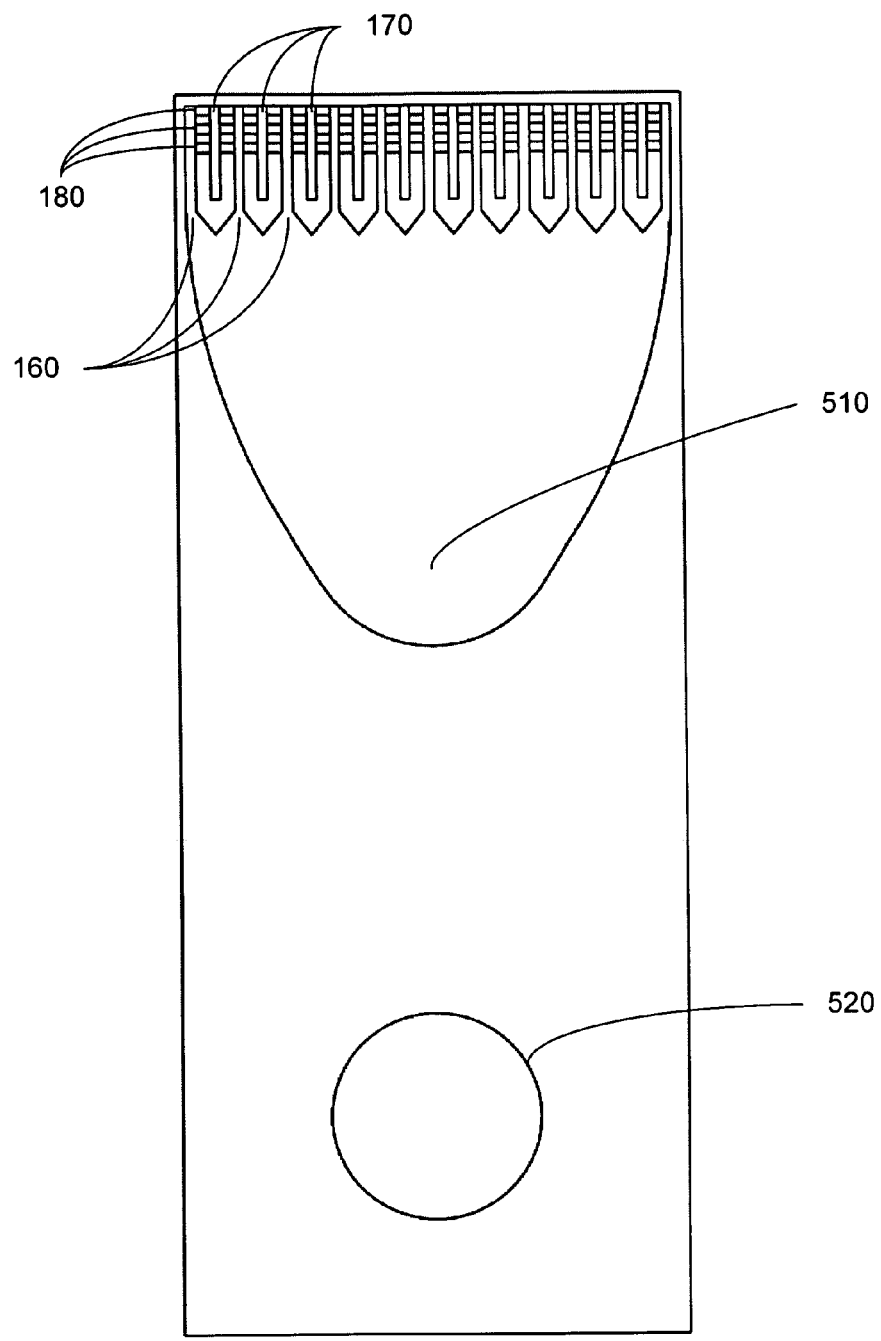
FIG. 6 is a plan view of an interior sheet which may form at least a portion of an apparatus for transferring heat with a target.

FIG. 6 shows a plan view of an upper interior sheet 600 which may form at least a portion of the apparatus for transferring heat with a target. A plurality of upper interior sheets may be coupled with upper sheet 500 in one embodiment to form a continuous inlet port 510, and a body of an apparatus. Fluid may flow from inlet port 510 to inlet manifold passages 160, be directed through heat transfer passages 180, and be received by outlet manifold passages 170. Upper interior sheet 600 may also define a portion of a continuous outlet port 520.

Figure 7:
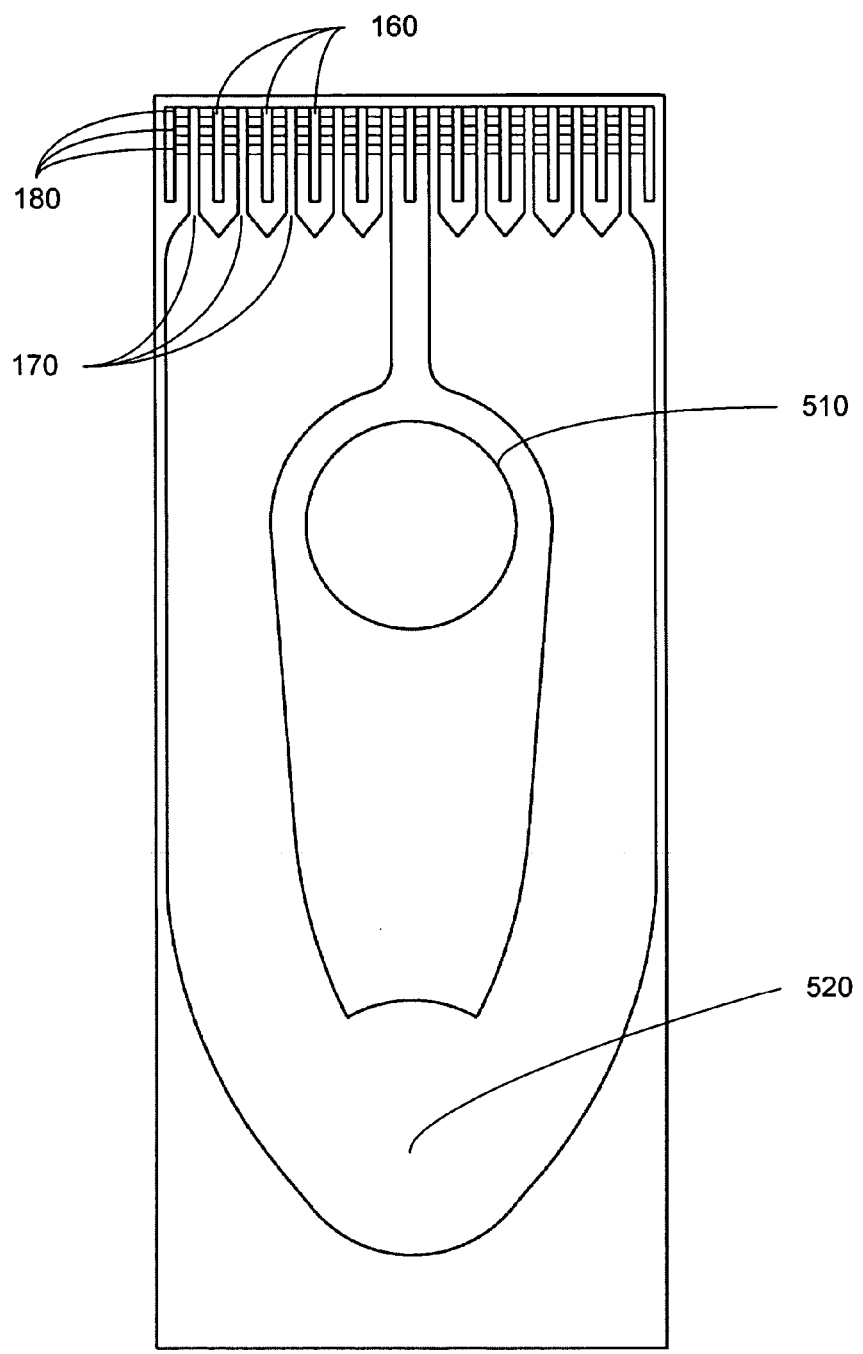
FIG. 7 is a plan view of another interior sheet which may form at least a portion of an apparatus for transferring heat with a target.

FIG. 7 shows a plan view of a lower interior sheet which may form at least a portion of the apparatus for transferring heat with a target. A plurality of lower interior sheets 700 may be coupled with other sheets to form a continuous outlet port 520, and the body of the apparatus. Fluid may flow from inlet manifold passages 160, be directed through heat transfer passages 180, and be received by outlet manifold passages 170. Fluid may then flow from outlet manifold passages 170 to outlet port 520. Lower interior sheet 700 may also define a portion of a continuous inlet port 510.

Figure 8:
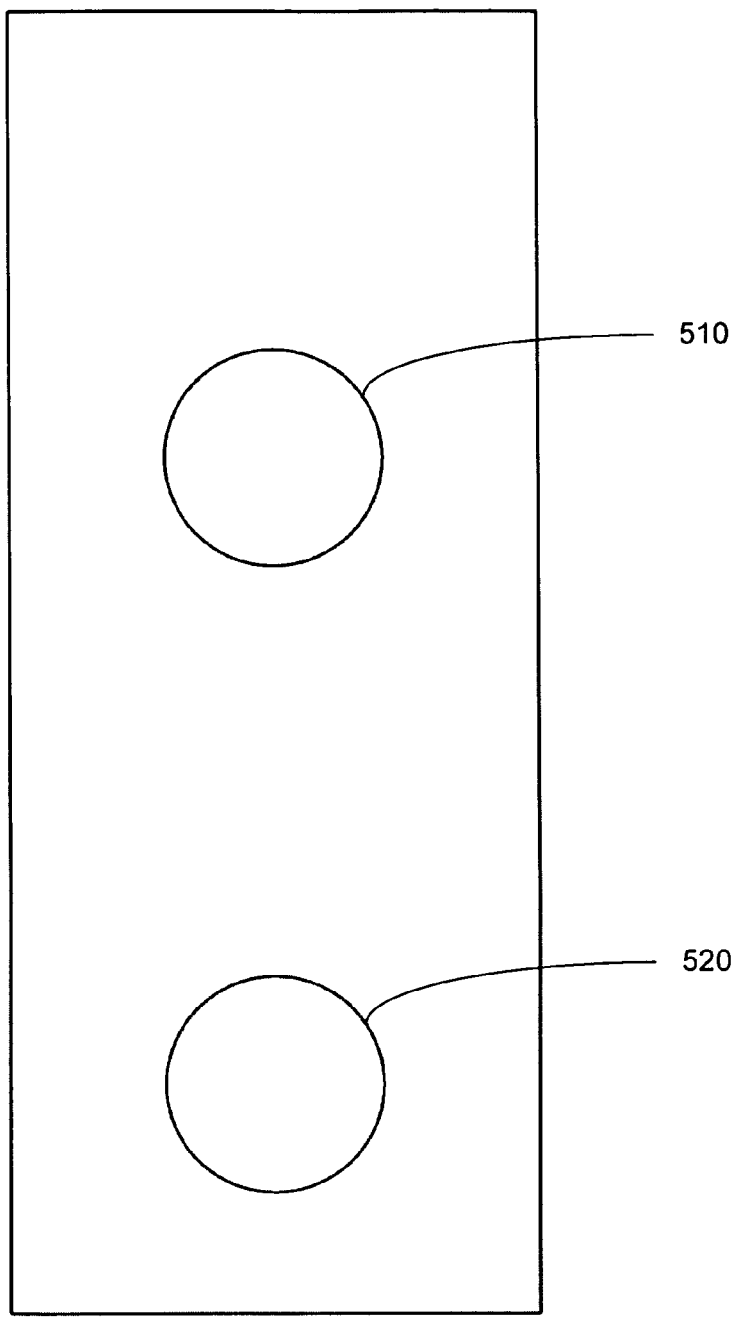
FIG. 8 is a plan view of a lower sheet which may form at least a portion of an apparatus for transferring heat with a target.

FIG. 8 shows a plan view of a lower sheet 800, including a portion of inlet port 510 and of outlet port 520 which may form at least a portion of the apparatus for transferring heat with a target. In this configuration then, inlet and outlet flows of fluid may be coupled to either side of the body formed by sheets 500, 600, 700, 800.

A number of variations and modifications of the invention can also be used within the scope of the invention. For example, a different manifold scheme could be used to deliver fluid to and from the heat transfer passages. In another example, various sheets, including the upper sheet and lower sheet, could have channels or features for encouraging flow to spread between all inlet manifold passages, or collect from all outlet manifold passages.

The invention has now been described in detail for the purposes of clarity and understanding. However, it will be appreciated that certain changes and modifications may be practiced within the scope of the appended claims.

What is claimed is:

1. An apparatus for transferring heat with a target, the apparatus including a body, wherein the body defines:
    a surface for coupling the target with the body, wherein heat transfers between the target and the body when the target is coupled with the body;
    an inlet port, wherein the inlet port is configured to:
        receive a fluid; and
        direct the fluid into a plurality of inlet manifold passages;
    the plurality of inlet manifold passages, wherein the plurality of inlet manifold passages are configured to:
        receive the fluid from the inlet port; and
        direct the fluid to a plurality of heat transfer passages;
    the plurality of heat transfer passages, wherein the plurality of heat transfer passages are configured to:
        receive the fluid from the plurality of inlet manifold passages;
        direct all of the fluid from the inlet manifold passages in one or more directions substantially parallel to the surface and substantially perpendicular to the plurality of input manifold passages; and direct the fluid to a plurality of outlet manifold passages, wherein heat transfers between the body and the fluid when fluid flows through the plurality of heat transfer passages;

the plurality of outlet manifold passages, wherein the plurality of outlet manifold passages are configured to:

receive the fluid from the plurality of heat transfer passages; and direct the fluid to an outlet port; and an outlet port, wherein the outlet port is configured to:

receive the fluid from the plurality of outlet manifold passages; and output the fluid.

2. The apparatus for removing heat from a heat source of claim 1, the apparatus further comprising the target.

3. The apparatus for removing heat from a heat source of claim 1, the target comprising a laser diode.

4. The apparatus for removing heat from a heat source of claim 1, wherein each of the plurality of heat transfer passages are characterized by a hydraulic diameter, and each of the plurality of heat transfer passages have a hydraulic diameter of about 500 microns or less.

5. An apparatus for transferring heat with a target, the apparatus comprising:

a plurality of sheets, wherein the plurality of sheets are coupled such that a body is formed by the coupled plurality of sheets, and wherein the body defines:

a surface for coupling the target with the body, wherein heat transfers between the target and the body when the target is coupled with the body;

an inlet port, wherein the inlet port is configured to:

receive a fluid; and direct the fluid into a plurality of inlet manifold passages;

the plurality of inlet manifold passages, wherein the plurality of inlet manifold passages are configured to:

receive the fluid from the inlet port; and direct the fluid to a plurality of heat transfer passages;

the plurality of heat transfer passages, wherein the plurality of heat transfer passages are configured to:

receive the fluid from the plurality of inlet manifold passages;

direct all of the fluid received from the inlet manifold passages in one or more directions substantially parallel to the surface and substantially perpendicular to the plurality of input manifold passages; and direct the fluid to a plurality of outlet manifold passages, wherein heat transfers between the body and the fluid when fluid flows through the plurality of heat transfer passages;

the plurality of outlet manifold passages, wherein the plurality of outlet manifold passages are configured to:

receive the fluid from the plurality of heat transfer passages; and direct the fluid to an outlet port; and the outlet port, wherein the outlet port is configured to:

receive the fluid from the plurality of outlet manifold passages; and output the fluid.

6. The apparatus for removing heat from a heat source of claim 5, wherein each of the plurality of sheets is characterized by a thickness and each of the plurality of heat transfer passages is characterized by a height, wherein the height of each of the plurality of heat transfer passages is substantially half of the thickness of at least one of the plurality of sheets.

7. The apparatus for removing heat from a heat source of claim 5, wherein each of the plurality of sheets is comprised of a selection from a group consisting of:

copper;

copper alloy;

molybdenum;

tungsten;

nickel;

aluminum;

stainless steel;

silicon;

beryllia;

aluminum nitride;

silicon carbide;

chemical vapor deposition diamond;

copper-diamond;

copper-graphite;

copper-tungsten; and copper-molybdenum.

8. The apparatus for removing heat from a heat source of claim 5, the plurality of sheets comprising an upper sheet, a plurality of interior sheets, and a lower sheet, wherein:

at least one of the upper sheet and the lower sheet define the surface;

at least one of the upper sheet, the plurality of interior sheets, and the lower sheet define the inlet port;

the plurality of interior sheets define:

the plurality of inlet manifold passages;

the plurality of heat transfer passages; and the plurality of outlet manifold passages; and at least one of the upper sheet, the plurality of interior sheets, and the lower sheet define the outlet port.

9. The apparatus for removing heat from a heat source of claim 8, wherein interior sheets coupled closer to the upper sheet define more heat transfer passages than interior sheets coupled closer to the lower sheet define.

10. The apparatus for removing heat from a heat source of claim 8, wherein at least two interior sheet define more than one heat transfer passages between one inlet manifold passage and one outlet manifold passage.

11. The apparatus for removing heat from a heat source of claim 8, wherein the upper sheet and lower sheet are characterized by a thickness, and the upper sheet and lower sheet are each between about 50 microns and about 10,000 microns thick.

12. The apparatus for removing heat from a heat source of claim 8, wherein the upper sheet and lower sheet are characterized by a thickness, and the upper sheet and lower sheet are each about 250 microns thick.

13. The apparatus for removing heat from a heat source of claim 8, wherein each of the plurality of interior sheets is characterized by a thickness, and each of the plurality of interior sheets is between about 12.5 microns and about 500 microns thick.

14. The apparatus for removing heat from a heat source of claim 8, wherein each of the plurality of interior sheets is characterized by a thickness, and each of the plurality of interior sheets is about 50 microns thick.

15. An apparatus for transferring heat with a target, the apparatus comprising:

an upper sheet;

a plurality of interior sheets; and a lower sheet, wherein:

the upper sheet defines a surface for coupling with a target, wherein heat transfers between the target and the upper sheet when the target is coupled with the surface;

at least one of the upper sheet, the plurality of interior sheets, and the lower sheet define the inlet port, wherein the inlet port is configured to receive a fluid;

the plurality of interior sheets are coupled with the upper sheet, wherein heat transfers between the upper sheet and the plurality of interior sheets, and wherein the plurality of interior sheets define:
- a plurality of inlet manifold passages for receiving the fluid from the inlet port;
- a plurality of heat transfer passages for receiving the fluid from the plurality of inlet manifold passages, wherein heat transfers between the fluid and the plurality of interior sheets, and wherein the plurality of heat transfer passages are configured to direct all of the fluid received from the inlet manifold passages in one or more directions substantially parallel to the surface; and
- a plurality of outlet manifold passages for receiving the fluid from the plurality of heat transfer passages; and the lower sheet is coupled with at least one of the plurality of interior sheets; and at least one of the upper sheet, the plurality of interior sheets, and the lower sheet define the outlet port, wherein the outlet port is configured to receive the fluid from the plurality of outlet manifold passages and output the fluid.

16. The apparatus for removing heat from a heat source of claim 15, wherein at least one of the upper sheet, the plurality of interior sheets, and the lower sheet comprise a shape, and the shape is formed by photochemical etching.

17. The apparatus for removing heat from a heat source of claim 15, wherein the plurality of sheets are coupled together by diffusion bonding.

18. The apparatus for removing heat from a heat source of claim 17, wherein the plurality of sheets are coated with a diffusion aid.

19. The apparatus for removing heat from a heat source of claim 18, the diffusion aid comprising nickel.

20. The apparatus for removing heat from a heat source of claim 15, wherein the plurality of sheets are coupled by soldering or brazing.

* * * * *